United States Patent [19]

Spear

[11] Patent Number: 4,778,163

[45] Date of Patent: Oct. 18, 1988

[54] AIR ACTUATED CLAMP

[76] Inventor: Larry R. Spear, 220 Sixth Ave. NE., Hampton, Iowa 50441

[21] Appl. No.: 79,933

[22] Filed: Jul. 31, 1987

[51] Int. Cl.[4] ............................................. B23Q 3/08
[52] U.S. Cl. .................................... 269/32; 269/233; 269/237
[58] Field of Search .................................... 269/91–94, 269/25, 27, 232, 32, 237, 238, 239, 233; 74/107, 99 R

[56] References Cited

U.S. PATENT DOCUMENTS

| 349,099 | 9/1886 | Hosack | 269/232 |
| 2,974,646 | 3/1961 | Miller et al. | 74/99 |
| 3,190,216 | 6/1965 | Keller . | |
| 3,572,216 | 3/1971 | Seesody | 269/91 |
| 3,722,371 | 3/1973 | Boyle | 74/99 |
| 3,724,836 | 4/1973 | Sendoykas et al. . | |
| 3,948,502 | 4/1976 | Waller et al. . | |
| 4,396,183 | 8/1983 | Lymburner . | |
| 4,494,739 | 1/1985 | Valentine . | |
| 4,500,081 | 2/1985 | Carossino | 269/93 |
| 4,618,131 | 10/1986 | Campisi et al. . | |

Primary Examiner—Robert C. Watson
Attorney, Agent, or Firm—Zarley, McKee, Thomte, Voorhees & Sease

[57] ABSTRACT

A pair of air cylinders are provided on the stand for holding a printed circuit board. A first jaw includes a sleeve having spiral slots at opposite ends which register with straight slots in sleeve sections on a second jaw and pins carried on an air cylinder and a piston rod head extend into the aligned slots. A spring normally contracts the air cylinder and air pressure overcomes the spring action to expand the cylinder and pivot the second jaw to a closed position relative to the first jaw for clamping the circuit board. In an alternative embodiment, the air cylinder is integral with a second jaw and a pin carried on the rod head moves in a spiral slot in a sleeve on the first jaw.

14 Claims, 2 Drawing Sheets

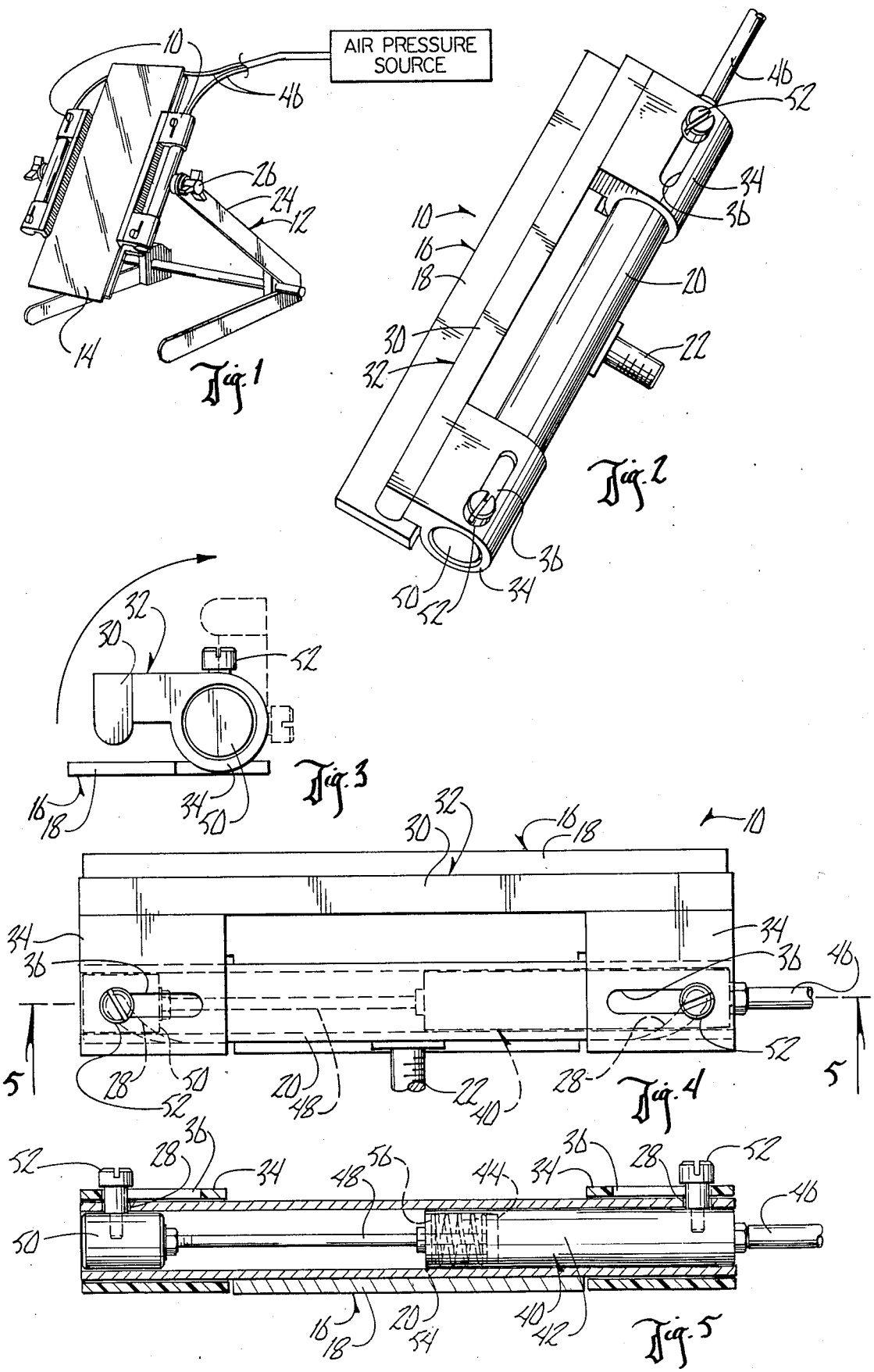

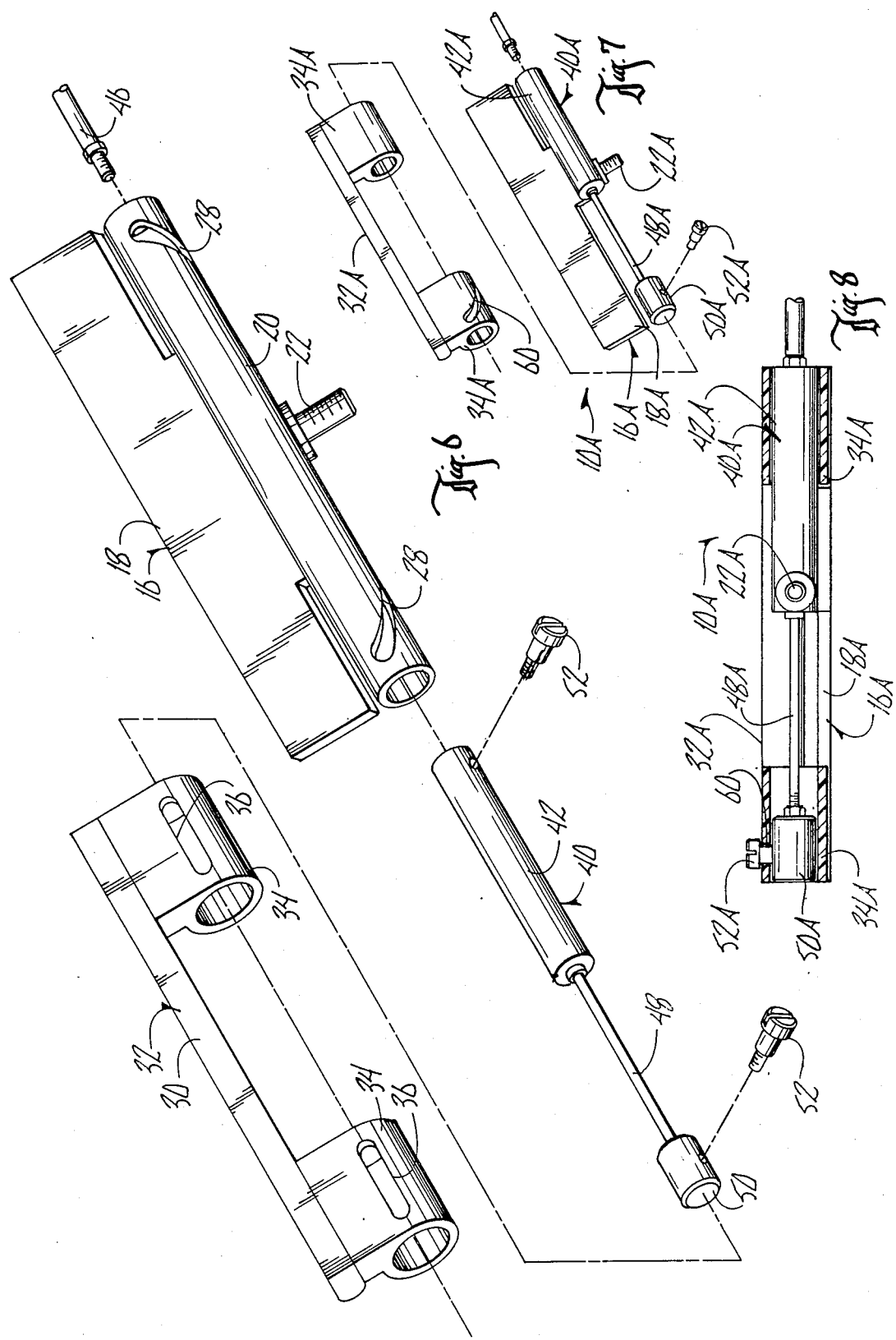

AIR ACTUATED CLAMP

BACKGROUND OF THE INVENTION

Work on printed circuit boards and similar articles requires use of a clamping device for holding the board in a position to be worked upon. The clamp must be easily opened and closed for purposes of inserting and removing the board. The clamps should be simple in construction and fast in operation. A positive predetermined amount of pressure should be applied to the board. Pressure should be uniform along the length of the clamp.

BRIEF DESCRIPTION OF THE INVENTION

The air clamp of this invention is simple to operate and gives fast positive action. It is normally spring biased to an open position. An air pressure source which may be foot operated applies pressure to a single acting air cylinder to cause the clamp jaws to close. One of the jaws is stationary, while the other jaw rotates ninety degrees (90°) from a horizontal closed position to a vertical open position. Two clamps are utilized, one on either side of the circuit board.

One jaw includes a sleeve having a pair of spiral slots at opposite ends. The second jaw has sleeve sections with straight slots telescoped over the first section such that the slots are in registering relationship. An air cylinder is positioned in the first sleeve and has laterally extending pins extending from the cylinder sleeve and from a head on the outer end of the piston rod. These pins extend through the aligned slots and when the piston is expanded and contracted the second jaw pivots between open and closed positions against the action of the spring in the sleeve cylinder normally tending to contract the cylinder and open the second jaw.

In an alternative embodiment, one of the sleeve sections of the second jaw includes the spiral slot and the air cylinder is an integral part of the first jaw, such that the pin carried on the rod head moving in the spiral slot opens and closes the second jaw.

BRIEF DESCRIPTION OF THE DRAWINGS

FIG. 1 is a perspective view of a pair of air clamps on a support stand with the clamps engaging opposite sides of a printed circuit board.

FIG. 2 is a perspective view of the air clamp.

FIG. 3 is an end elevational view thereof, showing the clamp in open and closed positions.

FIG. 4 is a top plan view.

FIG. 5 is a cross-sectional view taken along line 5—5 in FIG. 4.

FIG. 6 is an exploded perspective view of the air clamp.

FIG. 7 is an exploded view of an alternate embodiment.

FIG. 8 is a cross-sectional view taken along line 5—5 in FIG. 4 but of the alternate embodiment.

DETAILED DESCRIPTION OF THE PREFERRED EMBODIMENT

The air clamp of this invention is referred to generally in FIG. 2 by the reference numeral 10, and is shown in FIG. 1 on a stand 12 wherein a pair of clamps 10 are disposed on opposite sides of a printed circuit board 14 for holding it in position to be worked upon.

Clamp 10 includes a first stationary jaw 16 having a jaw member 18 integrally connected to an elongated sleeve 20. A pin 22 extending laterally from the sleeve intermediate its ends extends through the leg 24 of a stand 12 and is locked in position by an adjustment knob 26 as seen in FIG. 1.

Elongated ninety degree (90°) spiral slots 28 are disposed at opposite ends of the sleeve 20. A second jaw member 30 on a second jaw 32 opposes the jaw member 18. The jaw 32 includes opposite ends of the jaw member 30, sleeve sections 34, and straight axially extending slots 36 positioned to register with spiral slots 28 when the sleeve sections are telescopically positioned over the sleeve 20.

An air cylinder 40 includes a piston sleeve 42 in which a piston 44 moves in response to air pressure from an air source 46. A piston rod 48 extends out of the piston sleeve and moves a rod head 50. Transversely extending threaded pins 52 are connected to the piston sleeve 42 at its outer end and to the rod head 50 and extend through the spiral slots 28 and straight slots 36 as seen in FIGS. 2-5.

Thus, it is seen in operation that a spring 54 disposed between the piston 44 and the piston sleeve end wall 56 normally returns the air cylinder to a contracted position thereby opening the jaws by pivoting the jaw 32 to an upwardly extending position. When air pressure is applied to the air cylinder, the piston 44 moves to the left as seen in FIG. 5 causing the rod 48 to move the rod head 50 to the left with the pin 52 moving in the spiral slot 28 and the straight slot 36 forcing the jaw 32 to pivot downwardly into engagement with the printed circuit board 14 or the like disposed between the jaws 16 and 32. Similarly, the piston sleeve 42 moves to the right as the air pressure is applied to the air cylinder 40 and the pin 52 connected to the piston sleeve 42 moves in its spiral slot 28 in the sleeve 20 and in the straight slot 36 in the sleeve section 34, thereby applying uniform pressure to the pivotal jaw 32 at both ends, such that uniform pressure is applied to the circuit board 14.

An alternate embodiment of the air actuated clamp is shown in FIGS. 7 and 8 and is referred to generally by the reference numeral 10A. The jaw 32 includes a spiral slot 60 in one of the sleeve sections 34A. The air cylinder 40A is connected directly to the jaw member 18A of jaw 16A and the support pin 22A is connected to the side of the air cylinder. A piston rod 48A connected to the rod head 50A moves the pin 52A in the spiral slot 60 in the sleeve section 34A to move the jaw 32 between open and closed positions. The sleeve 20 of the first embodiment has been eliminated in this embodiment.

What is claimed is:

1. An air clamp comprising:
   a pair of jaws movable between opened and closed positions,
   one of said jaws having a sleeve and said sleeve operatively including a spiral slot extending parallel to the longitudinal axis of said sleeve, said jaw being pivotal about said sleeve axis in moving between said open and closed positions, and
   an air cylinder positioned in said sleeve and including pin means operatively received in said spiral slot whereby expansion and contraction of said air cylinder opens and closes said pair of jaws.

2. The air clamp of claim 1 wherein said sleeve is positioned in a second sleeve integrally connected to said other jaw and said air cylinder is in said second sleeve, said spiral slot is included in said second sleeve and said first sleeve includes a straight slot with said pin carried on said cylinder and extending through the spiral slot on said second sleeve into the straight slot on said first sleeve.

3. The air clamp of claim 2 wherein said cylinder includes a cylinder sleeve including a piston having a rod extending axially out of said piston sleeve and including a head on the outer end of said rod, said piston sleeve and said rod head having said pin and a second pin extending laterally therefrom and received in said longitudinally extending spiral slot and a second spiral slot in said second sleeve and into said straight longitudinal slots on said first sleeve.

4. The air clamp of claim 3 wherein said piston sleeve and said rod head are free to rotate as said cylinder is expanded and contracted and said pins move in said spiral slots.

5. The air clamp of claim 4 wherein said piston sleeve includes spring means biasing said piston in a direction to cause said spring means to be overcome by an air pressure source when said clamp is being closed.

6. The air clamp of claim 5 wherein said first sleeve includes longitudinally spaced apart sleeve sections with said sleeve sections being positioned on opposite ends of said second sleeve.

7. The air clamp of claim 6 wherein sleeve sections of said first jaw are interconnected by a jaw member opposed by a jaw member on said other jaw.

8. The air clamp of claim 7 wherein said other jaw is stationary relative to said first jaw and only said first jaw moves between open and closed positions.

9. The air clamp of claim 8 wherein said other jaw includes a support pin intermediate its end extending transversely of said jaw and being pivotally connected to a support stand whereby said clamp may be pivotally positioned as desired.

10. The air clamp of claim 9 wherein said support stand includes a pair of spaced apart clamps positioned to engage a work piece on opposite sides.

11. An air clamp comprising:
 a first jaw having a pair of spaced apart sleeve sections and said sleeve sections each including a straight longitudinal slot, and a jaw member integrally interconnecting said jaw sections,
 a second jaw having a sleeve and including spiral slots at opposite ends and being positioned in said sleeve sections of said first jaw with said spiral slots and said straight slots being in registering alignment, a jaw member integrally connected to said sleeve of said second jaw and opposing said first jaw member, and
 an air cylinder positioned in said second sleeve and including a piston having a rod extending longitudinally from a cylinder sleeve and having a head on its outer end, and laterally extending pins on said rod head and said cylinder sleeve extending into said spiral and straight sleeves for applying uniform pressure to opposite ends of each of said jaws as said cylinder is expanded and contracted.

12. The air clamp of claim 11 wherein a spring means is provided for normally opposing said air cylinder and maintaining said clamp in an open position.

13. The air clamp of claim 1 wherein said air cylinder is integrally connected to said other jaw and is positioned in the sleeve of the firt jaw.

14. The air clamp of claim 13 wherein said pin is carried on a rod head of said air cylinder and said spiral slot is in said sleeve of said first jaw.

* * * * *